United States Patent
Sanduleanu

(10) Patent No.: US 6,873,198 B2
(45) Date of Patent: Mar. 29, 2005

(54) TUNABLE QUADRATURE PHASE SHIFTER

(76) Inventor: Mihai Adrian Tiberiu Sanduleanu, Prof. Holstlaan 6, 5656 AA Eindhoven (NL)

( * ) Notice: Subject to any disclaimer, the term of this patent is extended or adjusted under 35 U.S.C. 154(b) by 60 days.

(21) Appl. No.: 10/073,706

(22) Filed: Feb. 11, 2002

(65) Prior Publication Data
US 2002/0158678 A1 Oct. 31, 2002

(30) Foreign Application Priority Data

Feb. 12, 2001 (EP) .......................................... 01200475
Aug. 16, 2001 (EP) .......................................... 01203127

(51) Int. Cl.⁷ ............................................ H03K 5/13
(52) U.S. Cl. ...................... 327/255; 327/238; 327/254
(58) Field of Search ................................ 327/231, 261, 327/238, 237, 254, 255

(56) References Cited

U.S. PATENT DOCUMENTS

| | | | | |
|---|---|---|---|---|
| 4,109,102 A | * | 8/1978 | Yoshida et al. ............. | 375/332 |
| 4,210,882 A | | 7/1980 | Roza et al. .................. | 333/166 |
| 4,806,888 A | * | 2/1989 | Salvage et al. ............. | 333/138 |
| 5,333,014 A | * | 7/1994 | Drewery et al. ............ | 348/453 |
| 6,054,883 A | | 4/2000 | Ishihara ...................... | 327/255 |
| 6,369,633 B1 | * | 4/2002 | Tsukahara .................... | 327/254 |
| 6,496,545 B1 | * | 12/2002 | Liu ............................. | 375/301 |

* cited by examiner

Primary Examiner—Terry D. Cunningham
(74) Attorney, Agent, or Firm—Aaron Waxler

(57) ABSTRACT

The present invention relates to a tunable quadrature phase shifter comprising an input (IN) for inputting an input signal (vin), splitting means (10) for splitting the input signal into two essentially orthogonal first and second signals (i1, i2), adding means (6) for adding said first and second signals (i1, i2), subtracting means (7) for subtracting said first and second signals (i1, i2), a first output (OUT+) for outputting a first output signal (vo1) based on the output signal from said adding means (6), and a second output (OUT−) for outputting a second output signal (vo2) based on the output signal from said subtracting means (7), wherein that said splitting means (10) is provided as an all-pass.

7 Claims, 6 Drawing Sheets

TUNABLE QUADRATURE PHASE SHIFTER

FIELD OF THE INVENTION

The present invention relates to a tunable quadrature phase shifter comprising an input means for inputting an input signal, splitting means for splitting the input signal into two essentially orthogonal first and second signals, adding means for adding said first and second signals, subtracting means for subtracting said first and second signals, a first output for outputting a first output signal based on the output signal from said adding means, and a second output for outputting a second output signal based on the output signal from said subtracting means.

BACKGROUND OF THE INVENTION

Such a phase shifter which provides two output signals in quadrature are used in e.g. mobile communication systems and other radio transmitter and receiver systems where an accurate 90 degrees phase shift is necessary to obtain a sufficient image rejection in the transmitter and to have a correct 90 degrees phase difference between the I (In-phase) and Q (Quadrature-phase) base band phase vector signals in the receiver. In particular, a possible application is the I/Q generation for RC/LC oscillators with large tuning range ("Sonet"/"SDH" applications). Further, such a phase shifter is used in polyphase filters, QUAMs, Low IF/Zero IF receivers as well as Data and Clock Recovery (DCR) and Phase-Looked-Loop (PLL) circuits.

Among the first known techniques for quadrature signal generation is the RC-CR technique shown in FIG. 1. Here, an input signal vin is shifted by $-\pi/4$ to form a first output signal vo1 and by $+\pi/4$ to form a second output signal vo2. The phase difference between the output signals vo1 and vo2 is always $\pi/2$, but the amplitudes of the output signals vo1 and vo2 are equal at one frequency $fo=1/(2\pi RC)$ only.

After shifting, limiting stages (not shown in FIG. 1) can be used, but amplitude limiting becomes difficult in the GHz range unless several stages are connected in cascade. This operation is possible in case only zero crossings of the signal are relevant. Nevertheless, there is always a mismatch in gain and amplitude between both the output signals vo1 and vo2 in the two parallel paths. Moreover, due to nonlinear effects, slew-rate (dvin/dt) like AM to PM conversion occurs. When the RC time constant varies with process and temperature, the cutoff frequency at which the amplitudes of both the output signals vo1 and vo2 are equal varies, too. Besides, the mismatch between passive components results also in a phase mismatch.

Another conventional method for quadrature generation is the Havens technique according to FIG. 2. The input signal is splitted into two branches by using a quadrature circuit 2 which has approximately quadrature outputs. The precision of this circuit is not mandatory. These two signals are:

$v1(t)=A\cos(\omega t)$ $v2(t)=A\cos(\omega t+\theta)$ (1).

After each of these two signals vo1 and vo2 is limited in amplitude by a limiter 4 and 5, respectively, these two signals are added by an adder 6 and also subtracted by a subtracter 7. Each of the signals from the outputs of the adder 6 and subtracter 7 are again limited in amplitude by limiters 8 and 9, respectively, to form the output signals vo1 and vo2. The interesting part comes from the fact that a phase imbalance from $\pi/2$ gives afterwards an amplitude mismatch between the two signals v1 and v2 cancelled away by the limiting action. This operation is explained below:

$$v1+v2 = 2A\cos\left(\frac{\theta}{2}\right)\cos\left(\omega t+\frac{\theta}{2}\right) \quad (2)$$

$$v1-v2 = 2A\sin\left(\frac{\theta}{2}\right)\sin\left(\omega t+\frac{\theta}{2}\right).$$

The amplitudes A of the sum and difference signals are equal if the phase shifter has two outputs in quadrature ($\theta=\pi/2$). Assuming that in the second signal v2 there is an amplitude mismatch of magnitude $\epsilon$, the equation for the second signal v2 reads as follows:

$v2=(A+\epsilon)\cos(\omega t+\theta)$ (3).

The effect of such error is that v1+v2 rotates counter-clockwise by $\Phi 1$ and v1−v2 clockwise by $\Phi 2$. In FIG. 3 the phasor diagram of the signals is shown. The two situations depicted correspond to the situation when no amplitude errors are present (FIG. 3a) and the situation when amplitude errors are present (FIG. 3b). From FIG. 3 one can find the phase errors $\Phi 1$ and $\Phi 2$ and the local phase error $\Phi 1+\Phi 2$ under the assumption that the a error $\epsilon$ is small when compared with the amplitude A, i.e. $\epsilon<<A$.

The equations for the phase errors $\Phi 1$ and $\Phi 2$ are $$\tan(\Phi 1) = \frac{\epsilon\sin\left(\frac{\theta}{2}\right)}{2A\cos\left(\frac{\theta}{2}\right)+\epsilon\cos\left(\frac{\theta}{2}\right)} \quad (4)$$

$$\tan(\Phi 2) = \frac{\epsilon\cos\left(\frac{\theta}{2}\right)}{2A\sin\left(\frac{\theta}{2}\right)+\epsilon\sin\left(\frac{\theta}{2}\right)}.$$

When $\epsilon<<A$ the result is:

$$\Phi 1 + \Phi 2 \cong \frac{\epsilon}{A\sin(\theta)}. \quad (5)$$

The amplitude mismatch $\epsilon$ leads to a phase mismatch. 1% amplitude mismatch generates 0.6° in phase. Although this method is better in terms of robustness to errors, the disadvantage consists in the use of the four limiters 4, 5, 8 and 9 which convert amplitude modulation into phase modulation. Another critical disadvantage is that even some amplitude errors are tolerated, the input quadrature generator produces for different frequencies unequal amplitudes. Therefore, when the above described quadrature generation circuit is coupled to oscillators for I/Q processing by tuning the oscillator within an octave for example, the amplitude of the two paths drastically varies.

FIG. 2 shows the closest prior art from which the invention proceeds.

EP 0 707 379 A1 discloses a tunable quadrature phase shifter including two branches each constituted by cascade connection of a filter, an amplifier and a summing circuit, and two cross-connections constituted by amplifiers interconnecting the filter of one branch to the summing circuit of the opposite branch. An accurate 90° phase shift between the two output signals is obtained by controlling the tail currents of the four amplifiers.

WO 92/11704 A1 describes a quadrature signal generator including a phase-locked loop configuration which comprises a voltage control phase-shift network, limiters, an exclusive-OR phase detector, a low phase filter, a differential voltage to current converter and a loop filter. The voltage controlled phase-shift network generates a phase shift for the differential quadrature signals. The exclusive-OR phase detector determines the phase error between the differential quadrature signals. The phase error is related to a voltage control signal which is coupled back to the voltage controlled phased-shift network to maintain a precise 90° phase relationship between the differential quadrature signals.

Due to the control mechanism, both the devices according to EP 0 707 379 A1 and WO 92/11704 A1 require a complex and expensive construction.

SUMMARY OF THE INVENTION

Accordingly, it is an object of the present invention to provide a simple construction which avoids the amplitude mismatch and can be used for oscillators with more than one octave frequency tuning.

In order to achieve the above and other objects, according to the present invention, there is provided a tunable quadrature phase shifter comprising an input means for inputting an input signal, splitting means for splitting the input signal into two essentially orthogonal first and second signals, adding means for adding said first and second signals, subtracting means for subtracting said first and second signals, a first output for outputting a first output signal based on the output signal from said adding means, and a second output for outputting a second output signal based on the output signal from said subtracting means, characterized in that said splitting means is provided as an all-pass.

Since an all-pass produces two quadrature signals with equal amplitudes and the gm/C time constant of an all-pass tracks the oscillation frequency (using the same tuning mechanism) of the input signal outputted by the oscillator, the amplitude mismatch is well reduced. This further allows to avoid limiters at the input and also at the output. So, the present invention uses gm/C tuning schemes with inherent I/Q matching.

Preferably, a first output buffer means for buffering said first output signal and a second output buffer means for buffering said second output signal are provided.

A further preferred embodiment of the present invention comprises a first transimpedance converter having its input connected to said input means. A modification of this embodiment still comprises a second transimpedance converter having its output connected to said first output and a third transimpedance converter having its output connected to said second output. The provision of transimpedance converters is recommended in case the input and output signals are provided as voltage signals. Usually, the transimpedance converters are transimpedance amplifiers.

In accordance with a still further preferred embodiment of the present invention, the first and second output buffer means are provided as said first and second transimpedance converters, respectively, since the transimpedance converters have buffering functions, too.

A further preferred embodiment of the present invention is characterized by at least a first transistor with its collector connected to its base and its emitter coupled to a predetermined potential, a second transistor with its base connected to the base of said first transistor and its emitter coupled to said predetermined fixed potential, and a capacitor coupled between the junction of the bases of said first and second transistor and said predetermined potential.

In case the tunable quadrature phase shifter is provided as a differential phase shifter, further preferred embodiment is characterized by at least a first transistor with its collector connected to its base and its emitter coupled to a predetermined potential, a second transistor with its base connected to the base of said first transistor and its emitter coupled to said predetermined potential, a third transistor with its collector connected to its base and its emitter coupled to a predetermined potential, a fourth transistor with its base connected to the base of said third transistor and its collector coupled to said predetermined potential, and a capacitor coupled between a first junction of the bases of said first and second transistors and a second junction of the bases of said third and fourth transistors.

In both recently above mentioned embodiments, the transistors can be npn transistors and/or the predetermined potential is zero (ground).

BRIEF DESCRIPTION OF THE DRAWINGS

The above and other objects and features of the present invention will become clear from the following description taken in conjunction with the preferred embodiment with reference to the accompanying drawings in which.

DETAILED DESCRIPTION

Figure 4:
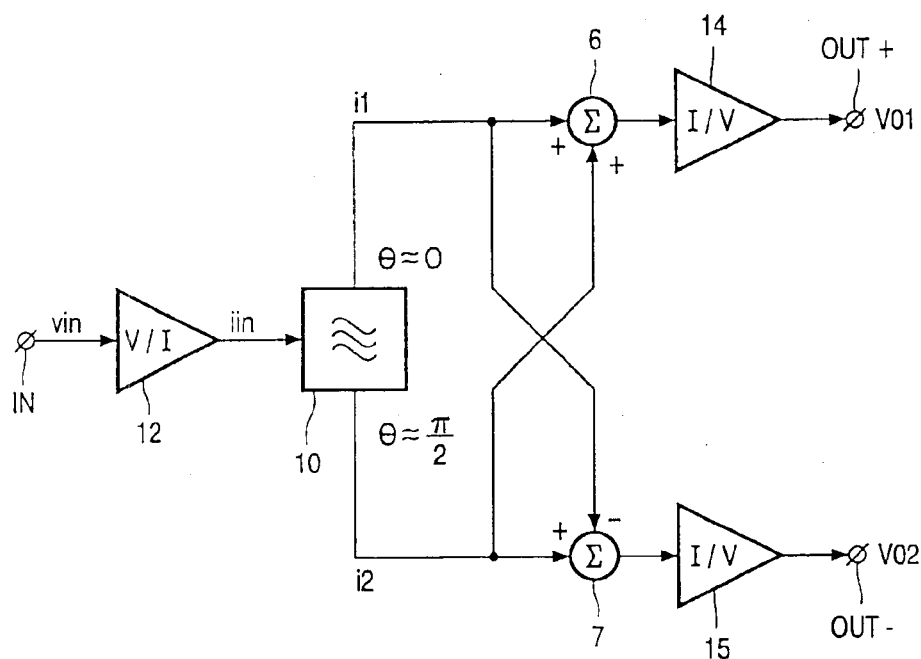
FIG. 4 shows a quadrature phase shifter in accordance with a preferred embodiment of the present invention.

In FIG. 4 is shown a preferred embodiment of the present invention.

Figure 2:
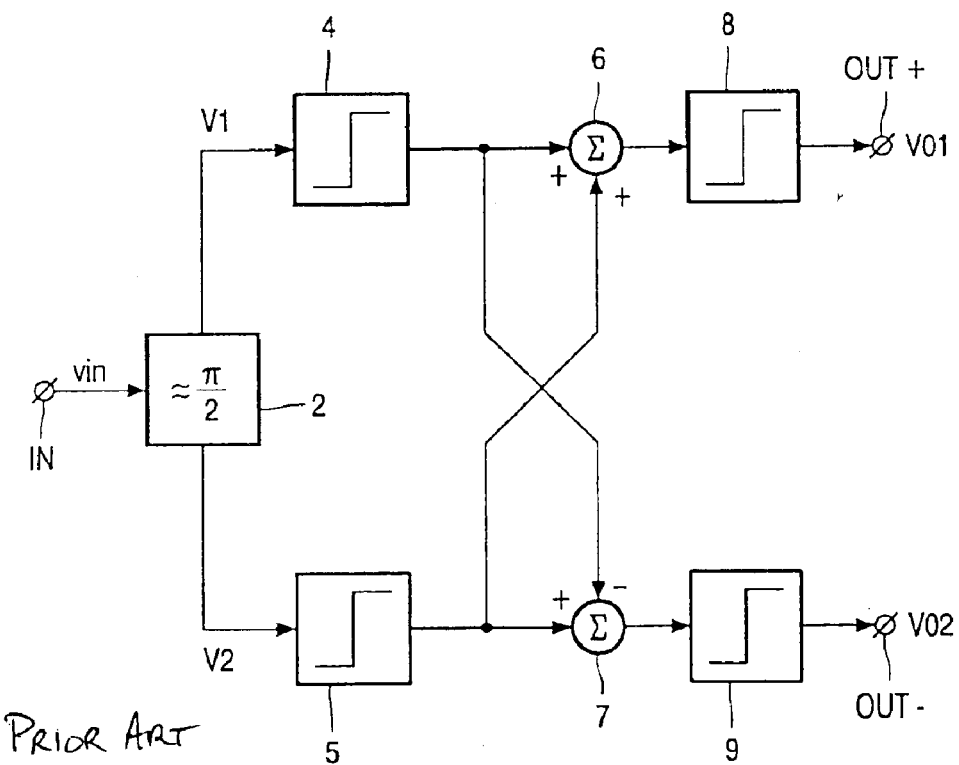
FIG. 2 shows a second conventional quadrature phase shifter using the Havens technique.

The architecture shown in FIG. 4 mainly differs from the conventional architecture of FIG. 2 in that instead of the quadrature circuit 2 an all-pass circuit 10 is provided which produces two quadrature signals with equal amplitudes.

In the preferred embodiment of FIG. 4, the input signal vin inputted at the input terminal IN is supplied to an input transimpedance amplifier 12. In the input transimpedance amplifier 12, the input signal vin is buffered and a voltage to current conversion takes place since in the preferred embodiment shown in FIG. 4 the input signal vin is a voltage signal. However, an input transimpedance amplifier 12 is not necessary in case the input signal vin is not a voltage signal, but a current signal.

The current signal iin outputted from the input transimpedance amplifier 12 is fed to the all-pass circuit 10 having two outputs and producing two quadrature signals with equal amplitudes. Since the gm/C time constant of the all-pass circuit 10 tracks the oscillation frequency (using the same tuning mechanism) of the input signal vin which is generated by an oscillator (not shown in FIG. 4), the amplitude mismatch is well reduced, and the signals i1 and i2 outputted from the all-pass circuit 10 are always in quadrature.

Figure 3:
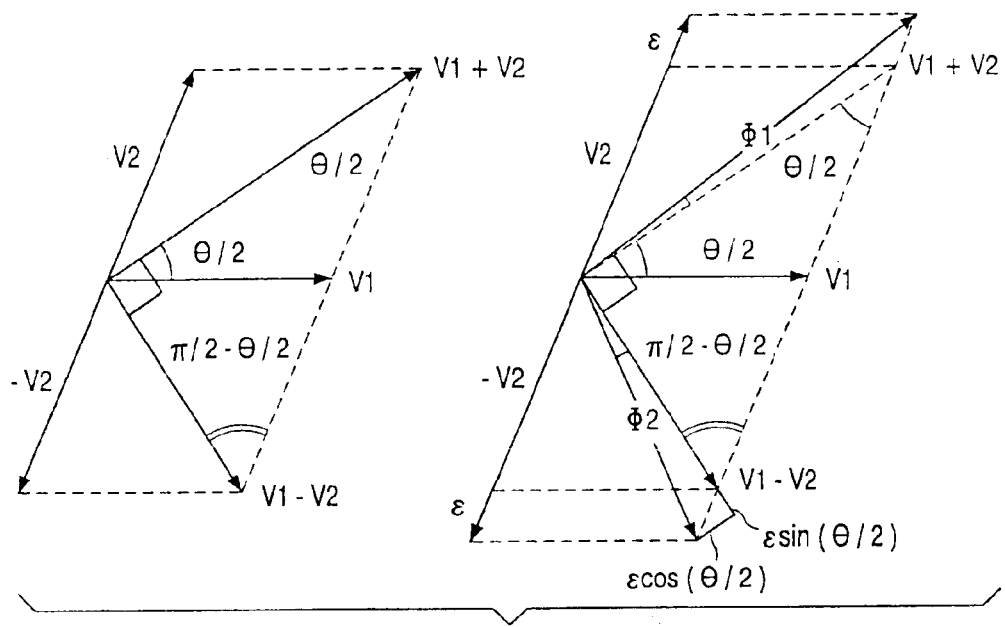
FIGS. 3a and b show phasor diagrams for the Havens technique used in the second conventional phase shifter.

FIG. 3 show phasor diagrams for the Havens technique used in the second conventional phase shifter;

The sum signal outputted from the adder 6 and the difference signal outputted from the subtractor 7 are applied to the input of first and second output transimpedance amplifiers 14 and 15 which buffer these signals and again convert them to voltage signals vo1 and vo2. These voltage signals vo1 and vo2 are the output signals outputted at the outputs OUT+ and OUT−. However, such output transimpedance amplifiers 14 and 15 are not necessary in case the output signal should remain a current signal.

Given the fact that the outputs of the all-pass circuit 10 are currents, in a differential implementation the two signals i1+i2 and i1−i2 can be easily generated. This is realized at the inputs of the output transimpedance amplifiers 14 and 15.

The all-pass transfer function is considered as follows:

$$H(s) = \frac{sC/g_m - 1}{sC/g_m + 1}; \quad s = j\omega \quad (6)$$

where $C/g_m$ is the time constant of the all-pass circuit 10 which can be tuned by tuning the transconductance $g_m$. The phase-shift of the all-pass circuit 10 depends on the frequency as follows:

$$\phi(\omega) = \pi - 2\arctan\left(\frac{\omega C}{g_m}\right). \quad (7)$$

The phase-shift of the network is $\pi/2$ when $\omega = g_m/C$. The time constant can be tuned such that this condition is always fulfilled. Now, the two signals i1+i2 and i1−i2 can be generated as follows:

$$i1 + i2 = i_i + i_i\left(\frac{sC/g_m - 1}{sC/g_m + 1}\right) = 2i_i - \frac{2i_i}{sC/g_m + 1} \quad (8)$$

$$i1 - i2 = i_i - i_i\left(\frac{sC/g_m - 1}{sC/g_m + 1}\right) = \frac{2i_i}{sC/g_m + 1}$$

Figure 5:
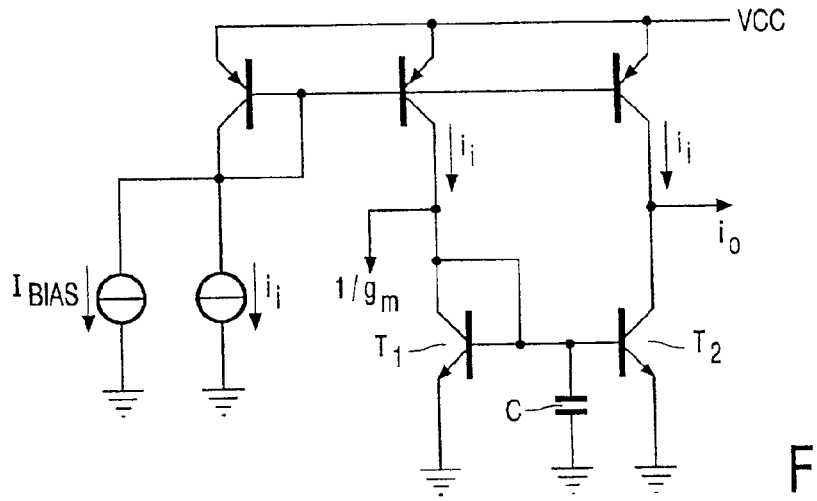
FIG. 5 a circuit diagram of an all-pass network comprising pnp and npn transistors.

In order to simplify the understanding of the circuit, reference is made to FIG. 5. Here, the input current $I_i$ is mirrored at the input of the phase shifter and at its output.

Assuming that C dominates over the parasitics seen at the same node and the current gain factor between the two npn transistors $T_1$ and $T_2$, of FIG. 5, it is easy to show that the transfer function of the circuit is:

$$\frac{I_o}{I_i} = \frac{sC/g_m - 1}{sC/g_m + 1}. \quad (9)$$

If the total circuit is biased with a DC current $I_{BIAS}$, the time constant $C/g_m$ of the network is tuned by changing $I_{BIAS}$ so as to change the transconductance $g_m$.

Figure 6:
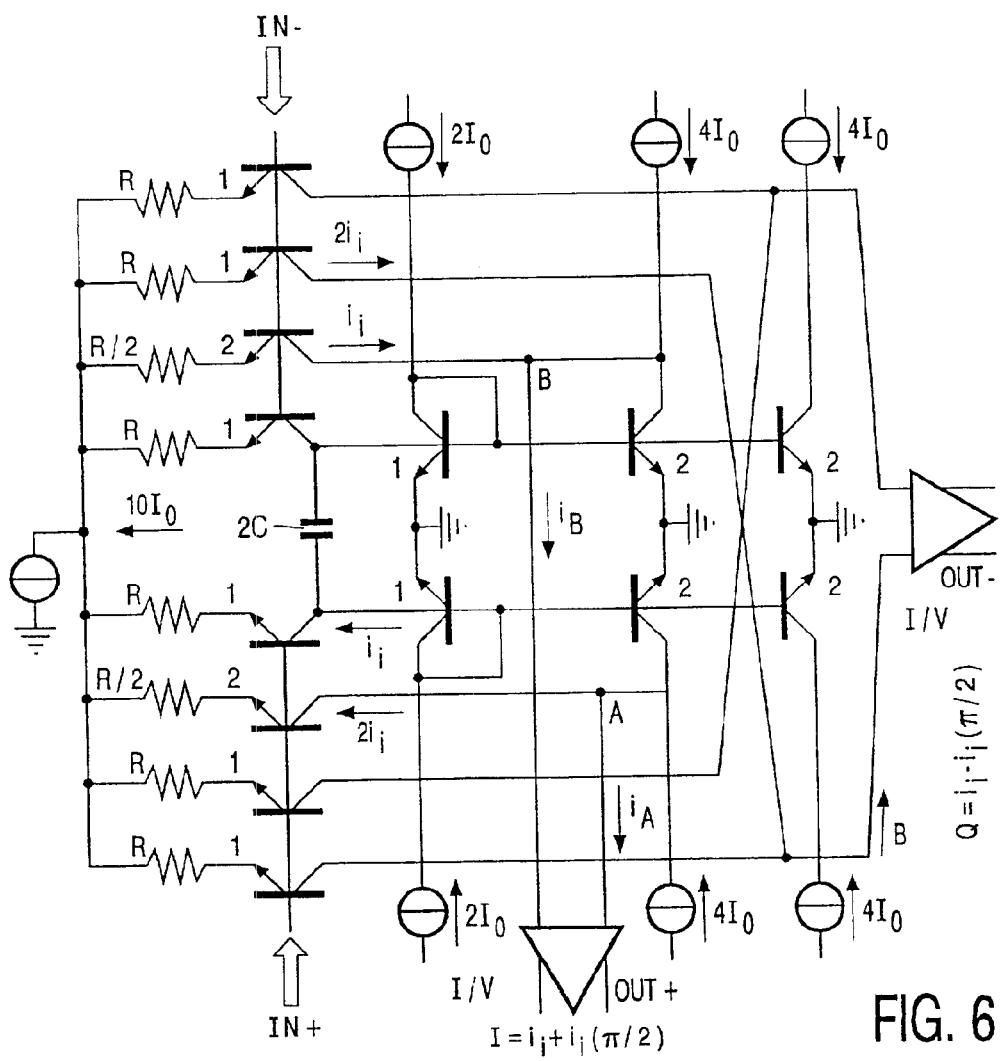
FIG. 6 a circuit diagram of an all-pass network for quadrature generation at transistor level view.

In a differential approach, pnp transistors are, however, not necessary, and therefore the clue is to generate the two signals i1+i2 and i1−i2 without the need for pnp transistors. Namely, it has been found that pnp transistors have bad frequency characteristics. A preferred embodiment of an circuit for the differential implementation of the quadrature generation is shown in FIG. 6.

The input voltage at IN+ and IN− is converted into current by using the emitter degenerated differential pair. Matching between currents is improved and also the linearity when compared to the situation without degeneration. At the summation node A of the transimpedence amplifier, the netto current flowing is:

$$i_A = \frac{2i_i}{sC/g_m + 1} - 2i_i \quad (10)$$

which looks like the negative output of the differential current i1+i2 from equation (8). At the subtraction node B, the netto current flowing is:

$$i_B = \frac{2i_i}{sC/g_m + 1}. \quad (11)$$

This reminds of i1−i2 from equation (8). The assumption in the equations (10) and (11) is that DC currents are not flowing at the output and only signal currents are passed to the output.

Figure 1:
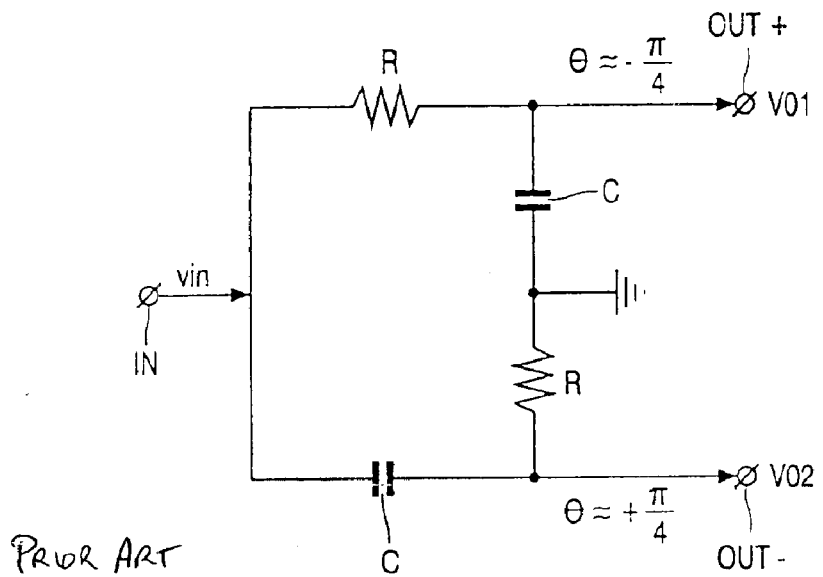
FIG. 1 shows a first conventional quadrature phase shifter using a simple RC-CR technique.
Figure 7A:
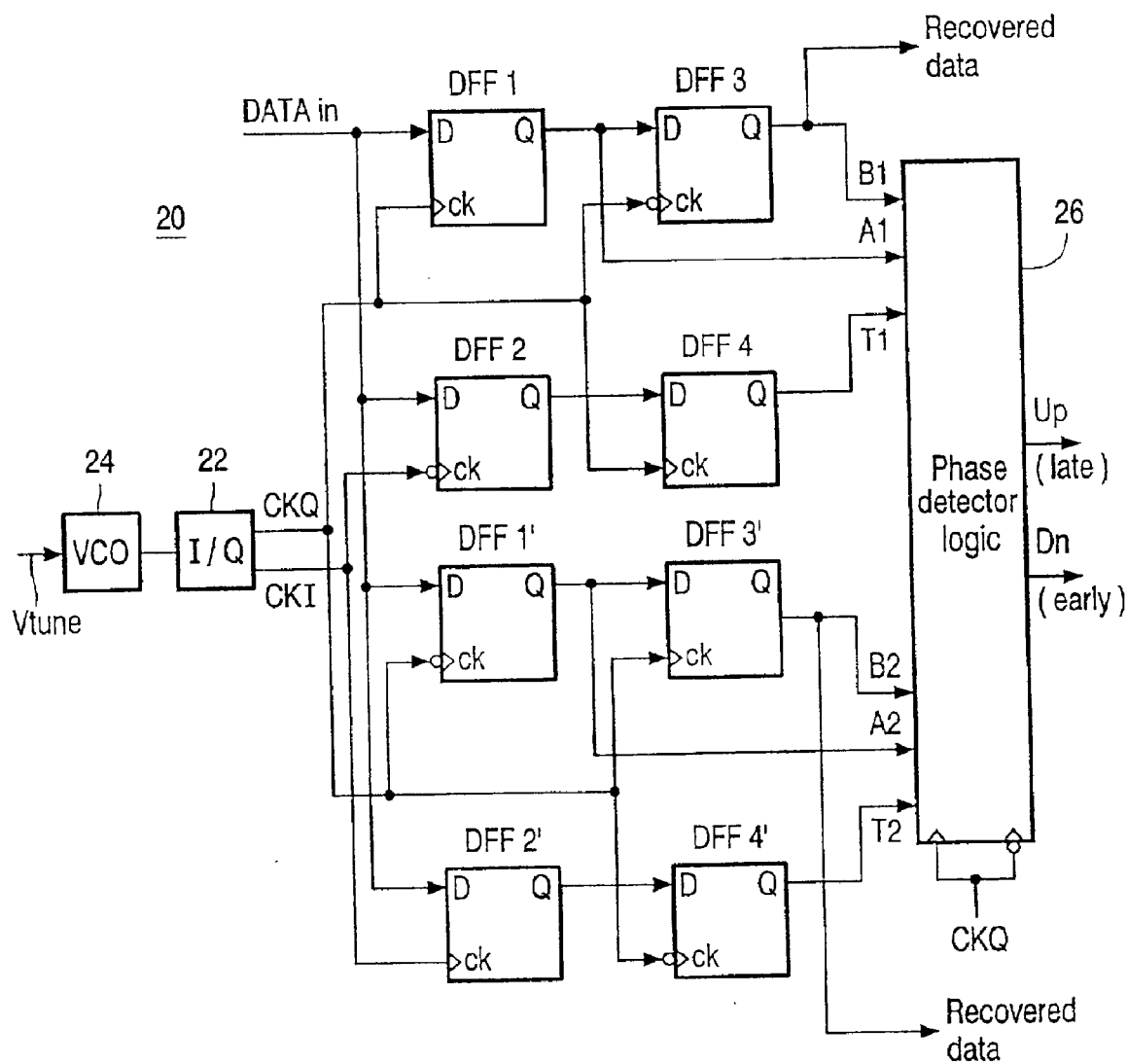
FIG. 7 an embodiment of a bang-bang phase detector including a quadrature phase shifter (a) and wave forms of the input and output signals of the quadrature phase shifter (b)

The implementation of the quadrature phase shifter in a bang-bang phase detector 20 is shown in FIG. 7a wherein the quadrature phase shifter is depicted as block 22. The quadrature phase shifter 22 outputs two signals CKI and CKQ corresponding to the output signals vo1 and vo2 as shown in FIGS. 1, 2 and 4. As further shown in FIG. 7a, the input of the quadrature phase shifter 22 is connected to an output of a voltage controlled oscillator (VCO) 24. A tuning signal vtune is input into the VCO 24. The output signal of the VCO 24 is the input signal of the quadrature phase shifter 22 and corresponds to vin of FIGS. 1, 2 and 4.

The bang-bang detector 20 further comprises several D flip-flops DFF1 to DFF4 and DFF1' to DFF4'. The two output signals CKI and CKQ of the quadrature phase shifter 22 are used to clock the D flip-flops. Further, the bang-bang detector 20 comprises a phase detector lodging 26 which is controlled by the D flip-flops.

Figure 7B:
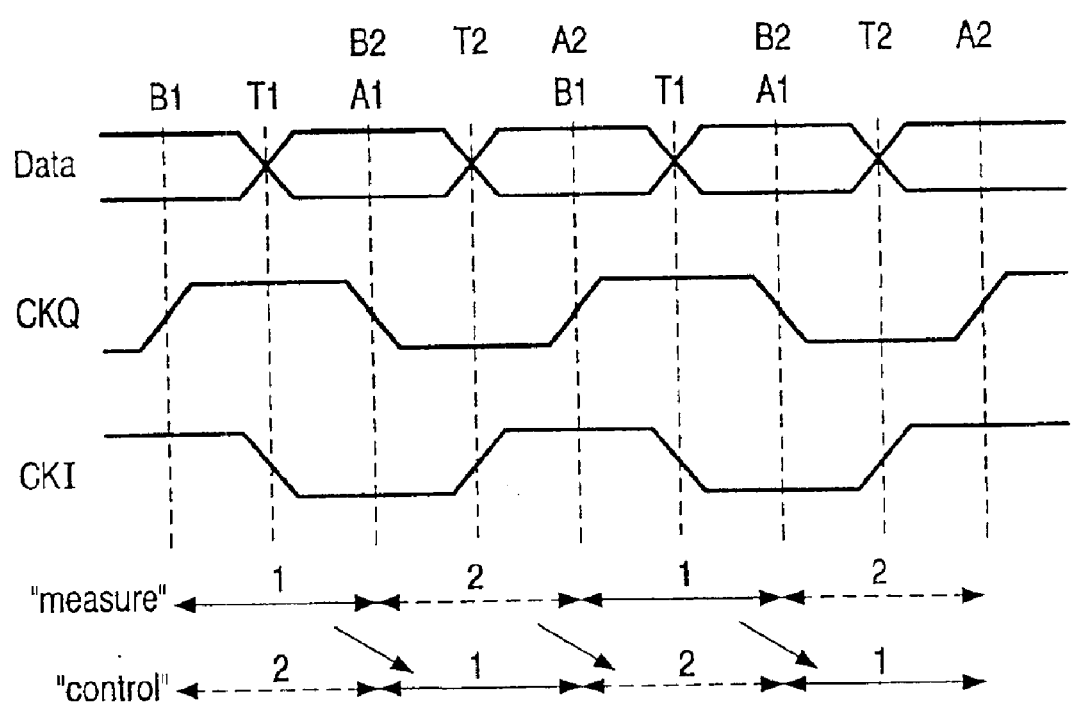

The wave forms of the input and output signals of the quadrature phase shifter 22 are shown in FIG. 7b.

The bang-bang detector of FIG. 7a is an interleaved version of an Alexander bang-bang phase detector based on quadrature voltage-controlled oscillation, wherein the VCO 24 is a LC-VCO without quadrature outputs and the quadrature generation is done outside the VCO 24 by the quadrature phase shifter 22. Since the quadrature generation is done outside the VCO 24, the phase noise of the oscillator is not impaired.

Figure 8:
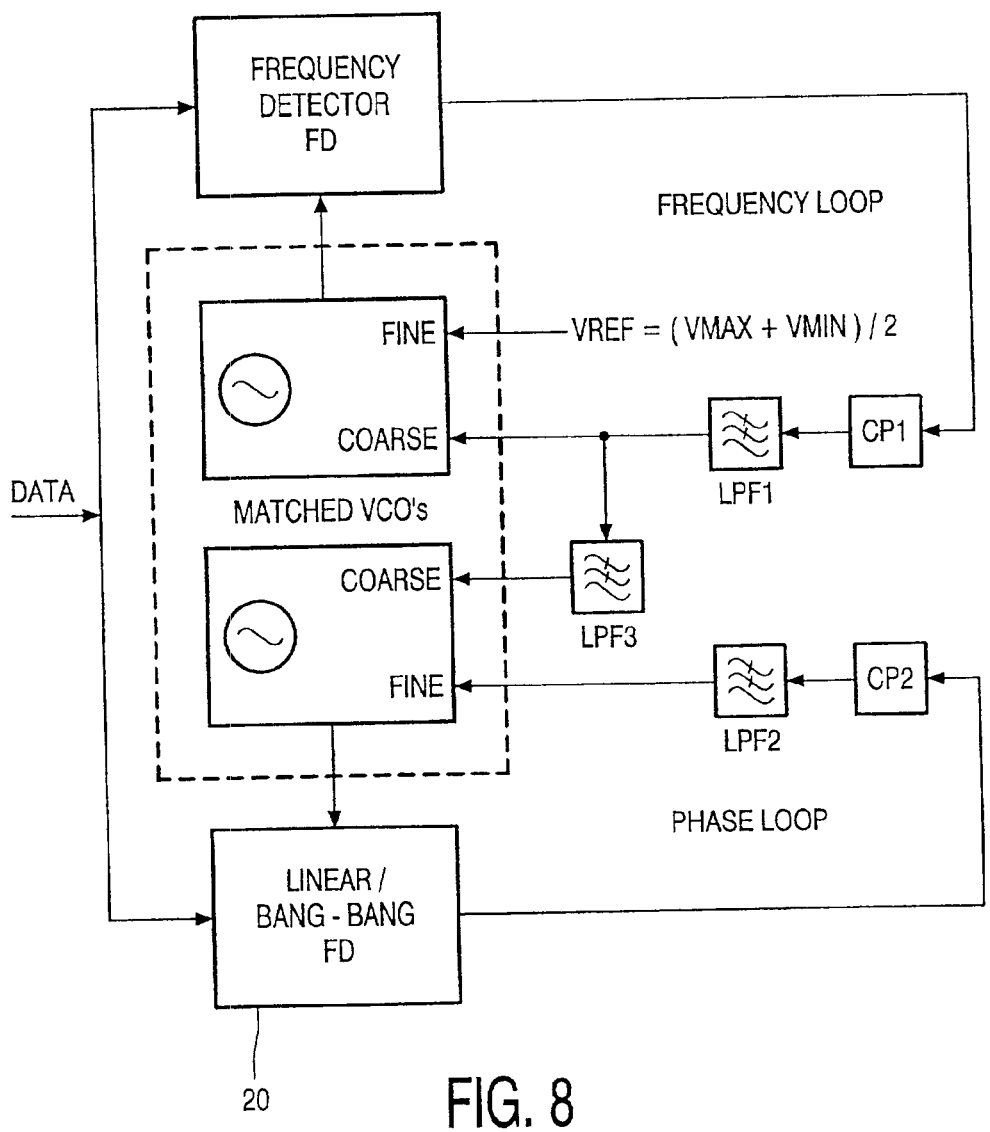
FIG. 8 an embodiment of a data and clock recovery unit including the bang-bang phase detector of FIG. 7.

FIG. 8 shows a data and clock recovery unit including the bang-bang detector of FIG. 7.

The advent of fiber optic communications has brought fully integrated optical receivers in which low-power becomes a must in order to cope with higher integration densities and the limited thermal capabilities of existing packages. At the receiver side, data and clock recovery units (DCR), PLL based, are needed to recover the clock information and to retime the incoming data. The data and clock recovery unit of FIG. 8 is based on a Master-Slave approach. This principle relies on matched oscillators and two control loops for frequency and phase acquisition respectively. At the transmitter part, a clock conversion circuit has to provide a pure clock to control the transitions of the data transmitted on fiber.

In clock-conversion circuits, PLL synthesizers are employed to generate a pure clock by cleaning-up the phase noise of the VCO. LC oscillators have inherently better phase noise performance than RC oscillators alleviating the requirements on the PLL loop bandwidth. In fact, an LC-VCO allows the use of a narrow-band loop with superior jitter transfer and low jitter generation. Another advantage of an LC oscillator consists in the frequency stability and the robustness towards temperature and process variations. The price usually paid is less tuning-range since integrated varicaps have limited capacitance variation with voltage. In such designs, a fundamental trade-off is the tunability versus phase-noise. As phase-noise is inversely proportional with the square of the quality factor of the tank circuit and the derivative of the phase of the LC tank is directly proportional with Q, it is obvious that one cannot get very good phase-noise performance along with large tuning ranges. By integrating the VCO with the complete LC tank the interference from outside world can be better controlled, and the pin-count can be better reduced. The aim of this paper is to show that one can achieve 1 GHz tuning range with an LC oscillator with low phase-noise by taking advantage of temperature and process variations compensation techniques. The design has been realized in a 30 GHz $f_T$ BiCMOS process making use only of MOS transistors in the VCO core and fast bipolar buffers for I/Q interfacing.

What is claimed is:

1. A tunable quadrature phase shifter, comprising:
   an input means for inputting an input signal;
   splitting means for splitting the input signal into two essentially orthogonal first and second signals;
   adding means for adding said first and second signals;
   subtracting means for subtracting said first and second signals;
   a first output for outputting a first output signal based on the output signal from said adding means; and
   a second output for outputting a second output signal based on the output signal from said subtracting means, wherein said splitting means is an all-pass having a time constant of $C/g_m$, where C is a capacitance in the subtracting means and $g_m$ is the transconductance of the subtracting means.

2. The phase shifter of claim 1, further comprising a first output buffer means for buffering said first output signal, and a second output buffer means for buffering said second output signal.

3. The phase shifter of claim 1, further comprising a first transimpedance converter having its input connected to said input means.

4. The phase shifter of claim 1, further comprising a first transimpedance converter having its output connected to said first output, and a second transimpedance converter having its output connected to said second output.

5. The phase shifter of claim 3, wherein the transimpedance converter is a transimpedance amplifier.

6. The phase shifter of claim 2, wherein said first and second output buffer means are first and second transimpedance converters, respectively.

7. A data and clock recovery unit comprising a phase detector which includes a phase shifter having
   an input means for inputting an input signal;
   splitting means for splitting the input signal into two essentially orthogonal first and second signals;
   adding means for adding said first and second signals;
   subtracting means for subtracting said first and second signals;
   a first output for outputting a first output signal based on the output signal from said adding means; and
   a second output for outputting a second output signal based on the output signal from said subtracting means, wherein said splitting means is an all-pass having a time constant of $C/g_m$, where C is a capacitance in the subtracting means and $g_m$ is the transconductance of the subtracting means.

* * * * *